United States Patent
Shin

(10) Patent No.: US 8,476,596 B2
(45) Date of Patent: Jul. 2, 2013

(54) THIN FILM TRANSISTOR ARRAY SUBSTRATE FOR X-RAY DETECTOR AND X-RAY DETECTOR

(75) Inventor: Chul-Woo Shin, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 49 days.

(21) Appl. No.: 13/301,486

(22) Filed: Nov. 21, 2011

(65) Prior Publication Data

US 2012/0161018 A1 Jun. 28, 2012

(30) Foreign Application Priority Data

Dec. 22, 2010 (KR) ........................ 10-2010-0132826

(51) Int. Cl.
*G01T 1/24* (2006.01)
(52) U.S. Cl.
USPC ............ 250/370.08; 250/370.01; 250/370.09
(58) Field of Classification Search
USPC .................................................. 250/370.08
See application file for complete search history.

(56) References Cited

U.S. PATENT DOCUMENTS

| | | | |
|---|---|---|---|
| 2001/0041376 A1 | 11/2001 | Watanabe et al. | |
| 2003/0038241 A1 | 2/2003 | Choo et al. | |
| 2005/0116937 A1 | 6/2005 | Choi et al. | |
| 2005/0128326 A1 | 6/2005 | Korthout et al. | |
| 2007/0164333 A1* | 7/2007 | Wright ........................ | 257/292 |
| 2008/0067324 A1 | 3/2008 | Heiler et al. | |
| 2008/0302969 A1 | 12/2008 | Jung et al. | |
| 2010/0001194 A1* | 1/2010 | Ishii et al. ................ | 250/370.08 |
| 2011/0147741 A1 | 6/2011 | Jung et al. | |

FOREIGN PATENT DOCUMENTS

| | | |
|---|---|---|
| JP | 2000-148037 A | 5/2000 |
| KR | 10-2003-0016536 A | 3/2003 |
| KR | 10-2005-0052674 A | 6/2005 |
| KR | 10-2006-0000315 A | 1/2006 |
| KR | 10-0852516 B1 | 8/2008 |
| KR | 10-2008-0108642 A | 12/2008 |
| KR | 10-2009-0057385 A | 6/2009 |
| KR | 10-2011-0070473 A | 6/2011 |

* cited by examiner

*Primary Examiner* — Marcus Taningco
(74) *Attorney, Agent, or Firm* — Knobbe, Martens, Olson & Bear LLP

(57) ABSTRACT

A thin film transistor (TFT) array substrate for an X-ray detector that improves a fill factor is disclosed. According to one aspect, the substrate includes a plurality of pixel areas each including a transistor area in which a TFT is formed, and a photodiode area in which a photodiode is formed. A first wire is formed in a first layer disposed in a lower portion of a photodiode layer in which the photodiode is formed, in at least a portion of the transistor area of the photodiode layer, and in a second layer disposed in an upper portion of the photodiode layer. A second wire, insulated from the first wire, extends in the pixel areas and is formed in the second layer. At least one TFT is formed in the transistor area and electrically connected to at least one of the first and second wires.

20 Claims, 8 Drawing Sheets

THIN FILM TRANSISTOR ARRAY SUBSTRATE FOR X-RAY DETECTOR AND X-RAY DETECTOR

CROSS-REFERENCE TO RELATED APPLICATIONS

This application claims the benefit of Korean Patent Application No. 10-2010-0132826, filed on Dec. 22, 2010, in the Korean Intellectual Property Office, the disclosure of which is incorporated herein in its entirety by reference.

BACKGROUND

1. Field

The disclosed technology relates to a thin film transistor (TFT) array substrate for an X-ray detector, and an X-ray detector including the TFT array substrate.

2. Description of the Related Technology

X-rays are easily transmitted through a target at a short wavelength. The amount of transmission of X-rays is determined based on a density of the target object. As a result, the interior of the target object can be indirectly imaged based on the amount of transmission of X-rays that are transmitted through the target object.

An X-ray detector detects the amount of transmission of X-rays that are transmitted through the target object. The X-ray detector may detect the amount of transmission of X-rays, thereby displaying internal state of the target object on a display device. The X-ray detector may generally be used for a medical inspection device, a minimally evasive inspection device, and the like.

Recently, a flat panel digital radiography (DR) type of X-ray detector that uses a DR method in which film is not required, has been widely used to display X-ray images.

The X-ray detector generates a signal current based on the amount of X-rays incident on a photosensitive device, such as a pin diode. Naturally, sensitivity of the device increases as the area of a particle-receiving surface increases. The area corresponding to the receiving surface corresponds to the area which is not occupied by other components of the detector. That is, the area that the pin diode can occupy is a function of the remaining area of the detector which is not occupied by other components of the detector. The degree to which stacking of components in a detector is employed is generally referred to as a "fill factor" of the detector. Therefore, improvement of the fill factor is necessary so as to increase the area of the particle-receiving surface of the X-ray detector.

SUMMARY OF CERTAIN INVENTIVE ASPECTS

According to some embodiments a thin film transistor (TFT) array substrate for an X-ray detector that increases photosensitivity of the X-ray detector by improving a fill factor of the X-ray detector, and an X-ray detector including the TFT array substrate.

According to one aspect, a thin film transistor (TFT) array substrate for an X-ray detector is disclosed. The TFT array substrate includes a substrate including a plurality of pixel areas each including a transistor area in which a TFT is formed, and a photodiode formed in a photodiode area. The TFT array substrate further includes a first wire extending through the plurality of pixel areas on the substrate, wherein the first wire is formed in a first layer disposed in a lower portion of a photodiode layer in which the photodiode is formed, in at least one portion of the transistor area, and wherein the first wire is formed in a second layer disposed in an upper portion of the photodiode layer in the photodiode area. The TFT substrate includes a second wire, insulated from the first wire, and extending in the plurality of pixel areas and formed in the second layer. At least one TFT is formed in the transistor area and electrically connected to at least one of the first wire and the second wire According to another aspect, an X-ray detector is disclosed. The X-ray detector includes a thin film transistor (TFT) array substrate comprising a plurality of photosensitive pixels comprising a photodiode generating an electrical detection signal corresponding to incident light and at least one transistor transmitting the electrical detection signal, a gate driver configured to supply gate pulses for turning on the at least one transistor to the plurality of photosensitive pixels, and a readout integrated circuit (IC) configured to read out the electrical detection signal from the plurality of photosensitive pixels. The TFT array substrate includes a substrate including a plurality of pixel areas each including a transistor area in which a TFT is formed, and a photodiode area in which a photodiode is formed. A first wire is formed and extends in the plurality of pixel areas on the substrate, wherein the first wire is formed in a first layer disposed in a lower portion of a photodiode layer in which the photodiode is formed, in at least one portion of the transistor area. The first wire is also formed to extend in a second layer disposed in an upper portion of the photodiode layer in the photodiode area. The TFT substrate includes a second wire insulated from the first wire, extending in the plurality of pixel areas and formed in the second layer. At least one TFT is formed in the transistor area and electrically connected to at least one of the first wire and the second wire.

BRIEF DESCRIPTION OF THE DRAWINGS

The above and other features and advantages will become more apparent by describing in detail exemplary embodiments thereof with reference to the attached drawings in which.

DETAILED DESCRIPTION OF CERTAIN INVENTIVE EMBODIMENTS

Figure 1:
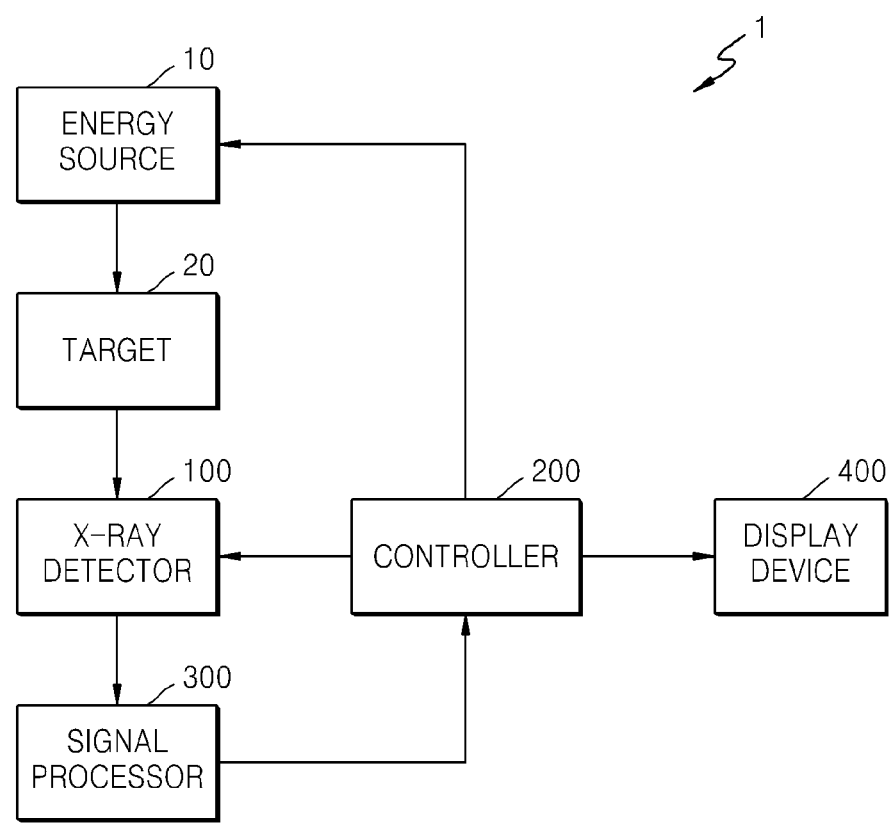
FIG. 1 is a block diagram of an X-ray detection system according to some embodiments.

Reference will now be made in detail to exemplary embodiments, examples of which are illustrated in the accompanying drawings. However, exemplary embodiments are not limited to the embodiments illustrated below. Rather, the embodiments herein are introduced to provide an understanding of the scope and spirit of exemplary embodiments. In the drawings, the thicknesses of layers and regions are drawn for scale and may be exaggerated for clarity.

It will be understood that when an element, such as a layer, a region, or a substrate, is referred to as being "on", "connected to" or "coupled to" another element, it may be directly on, connected or coupled to the other element or intervening elements may be present. Alternatively, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

The terminology used herein is for the purpose of describing some embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms (including technical and scientific terms) used herein have the same meaning as commonly understood by one of ordinary skill in the art to which exemplary embodiments belong. It will be further understood that commonly used terms should be interpreted to have their ordinary meaning in the context of the relevant technology and are not to be interpreted in an idealized or overly formal sense unless expressly so defined herein.

The present invention will now be described more fully with reference to the accompanying drawings in which exemplary embodiments of the invention are shown.

FIG. 1 is a block diagram of an X-ray detection system 1 according to some embodiments.

With reference to FIG. 1, the X-ray detection system 1 according to the some embodiments includes an energy source 10, an X-ray detector 100, a controller 200, a signal processor 300, and a display device 400.

The energy source 10 is a radioactive ray irradiation unit that irradiates radioactive rays, such as X rays, onto a target 20.

The X-ray detector 100 includes a plurality of photosensitive pixels for detecting the X-rays in a flat panel display. The X-ray detector 100 further includes a plurality of photodiodes that detect the amount of transmission of the X-rays that are transmitted through the target 20 and switching elements. When a reverse bias voltage is applied to the photodiodes and the X-rays are irradiated onto the photodiodes, an electrical detection signal that corresponds to the amount of transmission of the X-rays, is generated in each of the photodiodes. The electrical detection signal is read out through data lines DL and is input to a readout integrated circuit (IC) 150.

The X-ray detector 100 performs offset readout for obtaining an offset image when the X-rays are not irradiated and X-ray readout for obtaining an X-ray image when the X-rays are irradiated. Additionally, the X-ray detector 100 performs offset adjustment by scrubbing before performing offset readout and performs signal initialization by scrubbing before performing X-ray readout. Gate scanning during scrubbing can be performed at least two or more times.

The controller 200 controls operations of the energy source 10, the X-ray detector 100, and the display device 400 so as to form an offset-corrected X-ray image. The controller 200 controls an X-ray irradiation time of the energy source 10. Additionally, the controller 200 controls a driving sequence for obtaining the offset image of the X-ray detector 100 and a driving sequence for obtaining the X-ray image.

The signal processor 300 converts the detection signal output from the X-ray detector 100 into a digital signal. The signal processor 300 generates an offset image and an X-ray image from the digital signal. As an example, the offset image may be updated by calculating an average between the previously-generated offset image and the currently-generated offset image. The signal processor 300 generates an offset-corrected X-ray-captured image by subtracting the offset image generated before the X-rays are irradiated from the X-ray image.

The display device 400 displays the offset-corrected X-ray captured image. The display device 400 may be a liquid crystal display (LCD) device, an organic light-emitting display device, a plasma display device, or the like.

Figure 2:
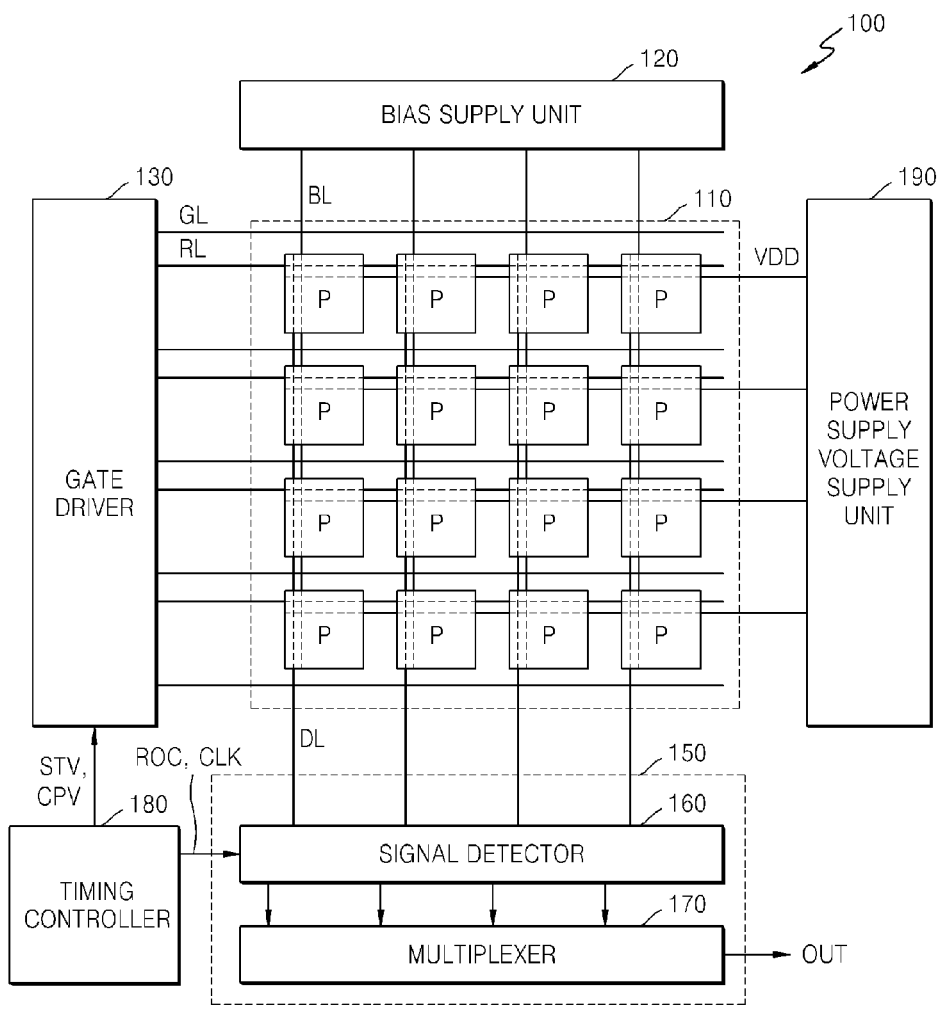
FIG. 2 is a schematic view of a structure of an X-ray detector of the X-ray detection system illustrated in FIG. 1, according to some embodiments.
Figure 3:
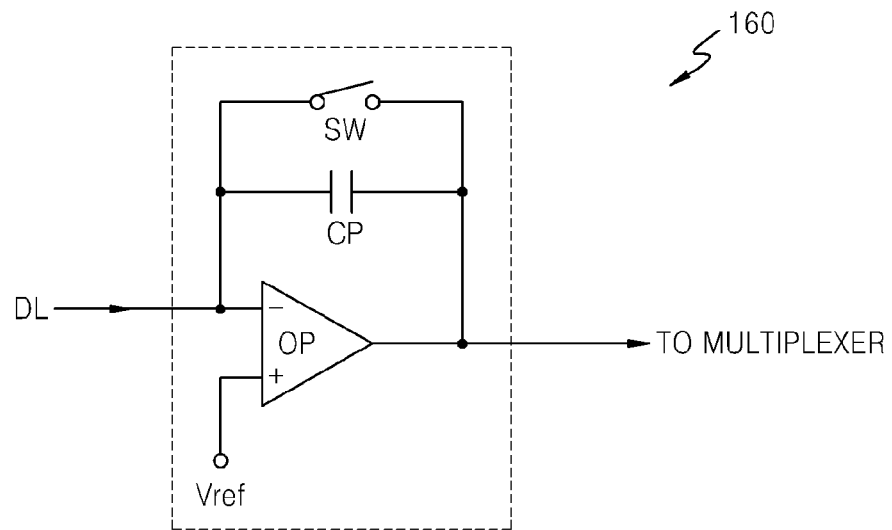
FIG. 3 is a view illustrating a structure of a signal detector of the X-ray detector illustrated in FIG. 2, according to some embodiments.

FIG. 2 is a schematic view of a structure of the X-ray detector 100 of the X-ray detection system 1 illustrated in FIG. 1, according to some embodiments. FIG. 3 is a view illustrating a structure of a signal detector 160 illustrated in FIG. 2.

With reference to FIG. 2, the X-ray detector 100 includes a thin film transistor (TFT) array substrate 110, a bias supply unit 120, a gate driver 130, a readout integrated circuit (IC) 150, a timing controller 180, and a power supply voltage supply unit 190. The readout IC 150 includes the signal detector 160 and a multiplexer 170.

The TFT array substrate 110 detects X-rays emitted from the energy source 10, photoelectrically transforms a detected signal and outputs the detected signal as an electrical detection signal. The TFT array substrate 100 includes a plurality of photosensitive pixels P arranged in the form of matrix close to an area where a plurality of gate lines GL and a plurality of data lines DL intersect one another. The plurality of gate lines GL and the plurality of data lines DL may be arranged to be almost orthogonal to one another. FIG. 2 illustrates 16 photosensitive pixels P arranged in 4 rows and 4 columns as an example. However, the present invention is not limited thereto, and the number of photosensitive pixels P may be varied.

Each of the photosensitive pixels P includes a photodiode PD that outputs a detection signal, i.e., a photosensitive voltage, by detecting the X-rays and at least one switching element that transmits the detection signal output from the photodiode PD in response to a gate pulse. The at least one switching element may be a transistor, for example. Hereinafter, an embodiment in which the switching element is a transistor will be described.

The photodiode PD detects the X-rays emitted from the energy source 10 and outputs a detected signal as a detection signal. The photodiode PD may be an element that converts incident light into an electrical detection signal due to a photoelectric effect. For example, the photodiode PD may be a pin diode.

The bias supply unit 120 applies a driving voltage to a plurality of bias lines BL. The bias supply unit 120 may apply a predetermined voltage to the photodiode PD or may optionally apply a reverse bias voltage or a forward bias voltage to the photodiode PD.

The gate driver 130 sequentially applies gate pulses having gate on voltage levels to the plurality of gate lines GL. Furthermore, the gate driver 130 may apply reset pulses having gate on voltage levels to a plurality of reset lines RL. The gate on voltage level is a voltage level at which transistors of the photosensitive pixels P are turned on. The transistors of the photosensitive pixels P may be turned on in response to the gate pulses or the reset pulses.

In response to the gate pulse, the detection signal output from the photodiode PD is input to the readout IC 150 through the data lines DL. The gate driver 130 may be in the form of an IC and may be mounted on one side of the TFT array substrate 110 or may be formed on a substrate such as the TFT array substrate 110 by performing a thin film process.

The readout IC 150 reads out the detection signal output from the transistor turned on in response to the gate pulse. The readout IC 150 reads out the detection signal output from the first photosensitive pixel P in an offset readout period in which the offset image is read out and in an X-ray readout period in which the detection signal after the X-rays are exposed is read out.

The readout IC 150 may include the signal detector 160 and the multiplexer 170.

The signal detector 160 includes a plurality of amplification units disposed in one-to-one correspondence with the plurality of data lines DL. Each of the amplification units includes an amplifier OP, a capacitor CP, and a reset element SW.

With reference to FIG. 3, the amplifier OP includes a first input terminal connected to the data lines DL, a second input terminal for receiving a reference voltage Vref, and an output terminal. The reference voltage Vref may be a ground voltage. The first input terminal may be an inversion input of the amplifier OP, and the second input terminal may be a non-inversion input of the amplifier OP. A signal output from the output terminal of the amplifier OP is input to the multiplexer 170.

One end of the capacitor CP is electrically connected to the first input terminal of the amplifier OP, and the other end of the capacitor CP is electrically connected to the output terminal of the amplifier OP.

The reset element SW resets the capacitor CP by discharging voltage charged in the capacitor CP. The reset element SW is connected to the capacitor CP in parallel. One end of the reset element SW is electrically connected to one end of the capacitor CP, and the other end of the reset element SW is electrically connected to the other end of the capacitor CP. The reset element SW may include a switch that electrically connects both terminals of the capacitor CP to each other. When the switch is closed, both terminals of the capacitor CP are electrically connected to each other, and voltage charged in the capacitor CP is discharged. The switch of the reset element SW is closed in a gate scanning mode and discharges the data lines DL.

The multiplexer 170 receives a voltage signal from the amplifier OP of the signal detector 160 and sequentially outputs the voltage signal to the signal processor 300. The multiplexer 170 may include switches each corresponding to the amplifier OP.

The timing controller 180 generates a start signal STV and a clock signal CPV and outputs the start signal STV and a clock signal CPV to the gate driver 130 so as to control the operation of the gate driver 130. Additionally, the timing controller 180 generates a readout control signal ROC and a readout clock signal CLK and outputs the readout control signal ROC and the readout clock signal CLK to the readout IC 150 so as to control the operation of the readout IC 150. The gate driver 130 and the readout IC 150 may operate by using a separate clock signal.

The power supply voltage supply unit 190 supplies a power supply voltage to the plurality of photosensitive pixels P through a plurality of power supply voltage lines VDD.

Figure 4:
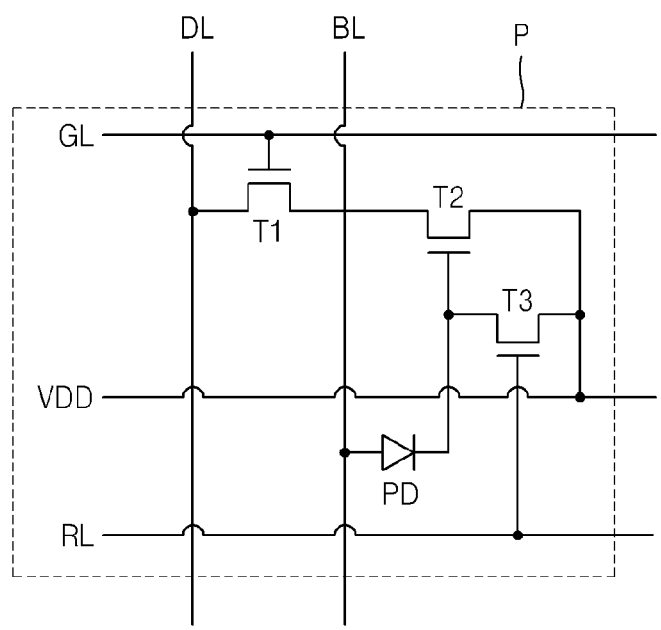
FIG. 4 is a circuit diagram of a structure of a photosensitive pixel, according to some embodiments.

FIG. 4 is a circuit diagram of a structure of the photosensitive pixel P according to some embodiments.

With reference to FIG. 4, the photosensitive pixel P according to the current embodiment of the present invention includes first through third transistors T1, T2, and T3, and a photodiode PD. The first transistor T1 includes a gate terminal connected to the gate lines GL, a first terminal connected to the data lines DL, and a second terminal connected to the first terminal of the second transistor T2. The second transistor T2 includes a gate terminal connected to a cathode of the photodiode PD and a first terminal of the third transistor T3, a first terminal connected to the second terminal of the first transistor T1, and a second terminal connected to a second terminal of the third transistor T3 and the power supply voltage lines VDD. The third transistor T3 includes a gate terminal connected to the reset lines RL, a first terminal connected to the gate terminal of the second transistor T2 and the cathode of the photodiode PD, and a second terminal connected to the second terminal of the second transistor T2 and the power supply voltage lines VDD. An anode of the photodiode PD is connected to the bias lines BL, and the cathode of the photodiode PD is connected to the gate terminal of the second transistor T2 and the first terminal of the third transistor T3.

The X-ray detector 100 is configured to operate such that it includes an exposure period, a readout period, and a reset period.

During the exposure period, the X-rays output from the energy source 10 to the X-ray detector 100 are input to the X-ray detector 100 through the target 20. The photodiode PD of each photosensitive pixel P of the X-ray detector 100 accumulates electric charge generated as a result of a photoelectric effect in proportion to the amount of incident X-rays. During the exposure period, a gate signal transmitted through the gate lines GL and a reset signal transmitted through the reset lines RL are set to a gate off voltage level. The gate off voltage level is a voltage level at which the first through third transistors T1 through T3 of the photosensitive pixel P are turned off. Therefore, in the exposure period, in a state where the first through third transistors T1 through T3 are turned off, electric charges generated due to the photoelectric phenomenon caused by the incident X-rays are accumulated in the photodiode PD.

The readout period is a period in which a detection signal generated due to exposure of the X-rays, or an offset image is read out. In the readout period, the gate signal has a gate on level, and the reset signal has a gate off level. Therefore, in the readout period, the first transistor T1 is turned on, and the third transistor T3 is turned off. The second transistor T2 generates current according to a voltage level of the cathode of the photodiode PD and transmits the current to the data lines DL through the first transistor T1. The detection signal is transmitted to the readout IC 150 through the data lines DL.

The reset period corresponds to a period in which the photosensitive pixel P is initialized. In the reset period, the gate signal has a gate off voltage level, and the reset signal has a gate on voltage level. Therefore, in the reset period, the first transistor T1 is turned off, and the third transistor T3 is turned on. As the third transistor T3 is turned on, the second transistor T2 acts as a source follower, and the power supply voltage transmitted through the power supply voltage lines VDD is applied to the cathode of the photodiode PD. As a result, the cathode of the photodiode PD is initialized due to the power supply voltage.

The exposure period, the readout period, and the reset period may be set in various ways according to some embodiments.

Figure 5:
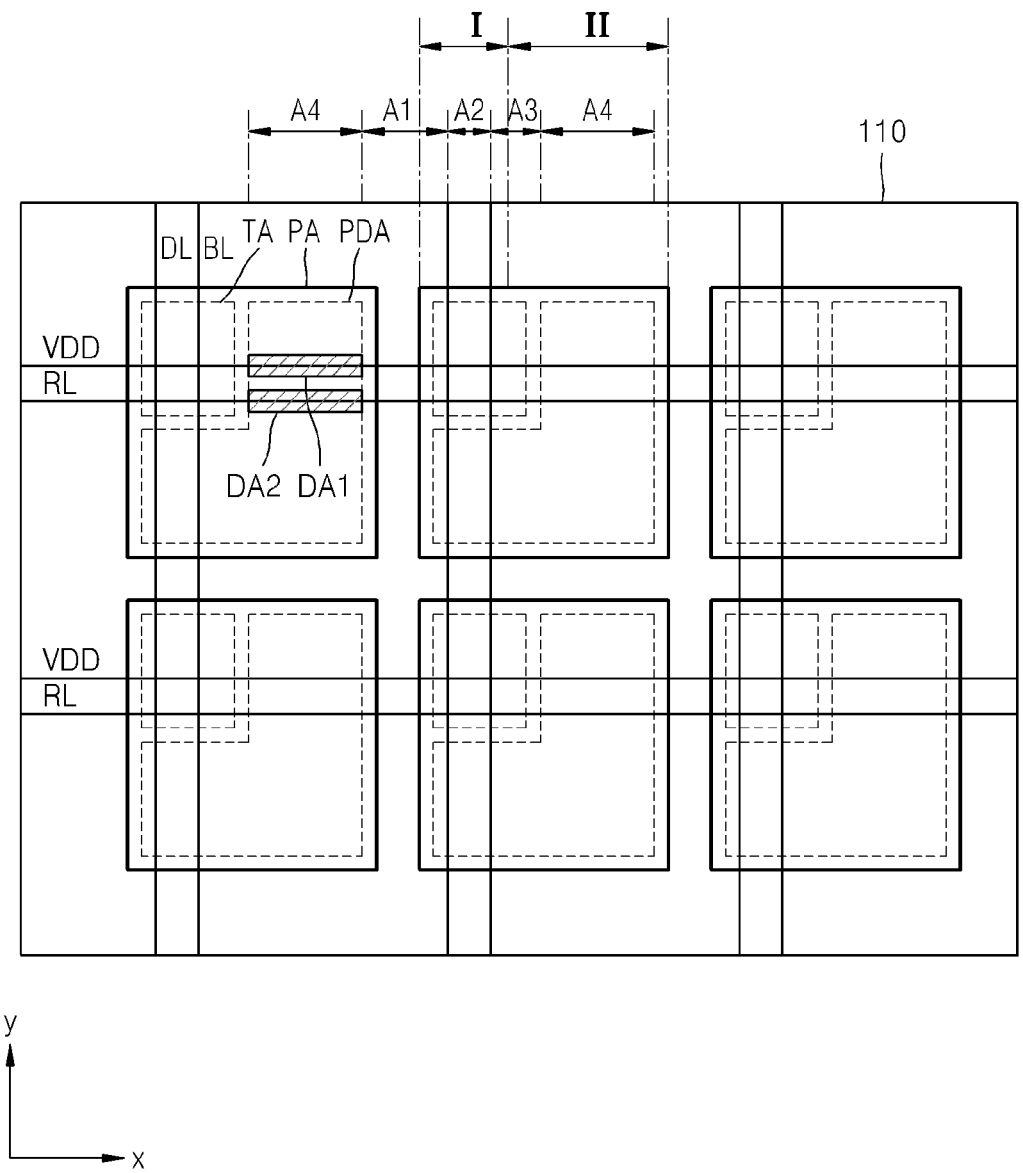
FIG. 5 illustrates the arrangement of a pixel area in which a plurality of photosensitive pixels are arranged and wire connections, according to some embodiments.

FIG. 5 illustrates the arrangement of a pixel area PA in which a plurality of photosensitive pixels P are arranged and wirings, according to some embodiments.

With reference to FIG. 5, each photosensitive pixel P according to the current embodiment of the present invention includes a transistor area TA and a photodiode area PDA. In the transistor area TA, first through third transistors T1 through T3 may be formed in the form of TFT, and the photodiode PD is formed in the photodiode area PDA. When the photodiode PD is a pin diode, the pin diode can be formed in the photodiode area PDA. Additionally, in order to drive the photosensitive pixel P, the data lines DL and the bias lines BL may extend in a y-direction, and the power supply voltage lines VDD and the reset lines RL may extend in an x-direction. Hereinafter, an embodiment in which the photodiode PD is configured to be a pin diode will be described. However, the present invention is not limited thereto, and the photodiode PD may be configured to be various types of photosensitive device.

Since the X-ray detector 100 has photosensitivity increased as the area of the photodiode area PDA is increased, the transistor area TA may be set as small as possible, and the photodiode area PDA may set to be as large as possible.

However, even when the area of the transistor area TA is reduced, the area of the photodiode area PDA may be limited due to wire connections which are part of the circuit. When wires are stacked so as to form the first through third transistors T1 through T3 and the photodiodes PD such that the wires are arranged in a lower layer of the photodiode layer, an amount of noise generated in the wire due to the photodiode PD is increased. Since a distance between a lower electrode layer of the photodiode PD, and a wiring layer area is a small area, the number of a components providing electric charge formed by the lower electrode layer of the photodiode PD, the wiring layer, and an insulating layer formed between the lower electrode layer of the photodiode PD and the wiring layer increases. As a result, a large amount of noise is generated in the wires. Noise is mainly generated when the wires arranged in the lower layer of the photodiode layer is a signal wire such as the reset line RL, the gate line GL, or the data line DL. If the wire is arranged in the lower layer of the photodiode area PDA so as to prevent noise from being generated in the wire, the photodiode PD may not be formed only in an area in which the wire is arranged. For example, in FIG. 5, when the power supply voltage lines VDD and the reset lines RL are formed in the lower layer of the photodiode layer, the photodiode PD may not be formed in an area in which the power supply voltage lines VDD and the reset lines RL are formed. Specifically, in FIG. 5, the photodiode PD may not be formed in a first wire area DA1 and a second wire area DA2. However, in this case, the area of a region of the photodiode area PDA in which the photodiode PD is formed, is reduced so that a fill factor of the X-ray detector 100 can be reduced.

According to some embodiments, in at least portions of the transistor area TA, a first wire is arranged in a first layer that is the lower layer of the photodiode layer, and in the photodiode area PDA, the first wire is arranged in a second layer that is an upper layer of the photodiode layer. The second layer is a layer in which a second wire or a predetermined electrode is arranged. According to embodiments of the present invention, through the structure, the fill factor of the X-ray detector 100 can be improved. For example, in FIG. 5, in at least portions of the transistor area TA, the reset lines RL are arranged in the first layer that is the lower layer of the photodiode layer, and in the photodiode area PDA, the reset lines RL are arranged in the second layer that is the upper layer of the photodiode layer so that the photodiode PD can also be formed in the second wire area DA2. Thus, the area of the photodiode PD is increased, and photosensitivity is improved. The second layer may be a layer in which the data lines DL and the bias lines BL are arranged.

Although, in FIG. 5, the power supply voltage lines VDD and the reset lines RL are alternately arranged in the first and second layers and the data lines DL and the bias lines BL are arranged in the second layer, the present invention is not limited thereto, and the data lines DL and the bias lines BL may be alternately arranged in the first and second layers, and the power supply voltage lines VDD and the reset lines RL may be arranged in the second layer. Additionally, wire to be arranged in the TFT array substrate 100 may be determined in various ways according to some embodiments, and the present invention includes these cases. Hereinafter, an embodiment in which the reset lines RL are arranged in the first layer that is the lower layer of the photodiode layer in at least portions of the transistor area TA and in the second layer that is the upper layer of the photodiode layer in the photodiode area PDA and the power supply voltage lines VDD are arranged in the first layer and the data lines DL and the bias lines BL are arranged in the second layer, will be described. In the embodiment, the reset lines RL are first wires, and the data lines DL and the bias lines BL are second wires.

According to some embodiments, the reset lines RL may be arranged in the first layer in at least area A2 of FIG. 5 and in the second layer in at least area A4 of FIG. 5. Additionally, an interlayer connection portion between the reset lines RL of the second layer and the reset lines RL of the first layer may be formed in at least areas A1 and A3 of FIG. 5.

Thus, as an example of some embodiments, the reset lines RL may be arranged in the first layer in a first area I and in the second layer in a second area II. The first area I may be determined by an area in which the second wire is arranged. Since the first wire and the second wire need to be electrically separated from each other, in the area in which the second wire is arranged, the first wire may not be arranged in the second layer. Thus, the first area I may be determined to include all of areas in which the second wire is arranged. In FIG. 5, the first area I may be determined to include all of the data lines DL and the bias lines BL or to include at least area A2.

Figure 6:
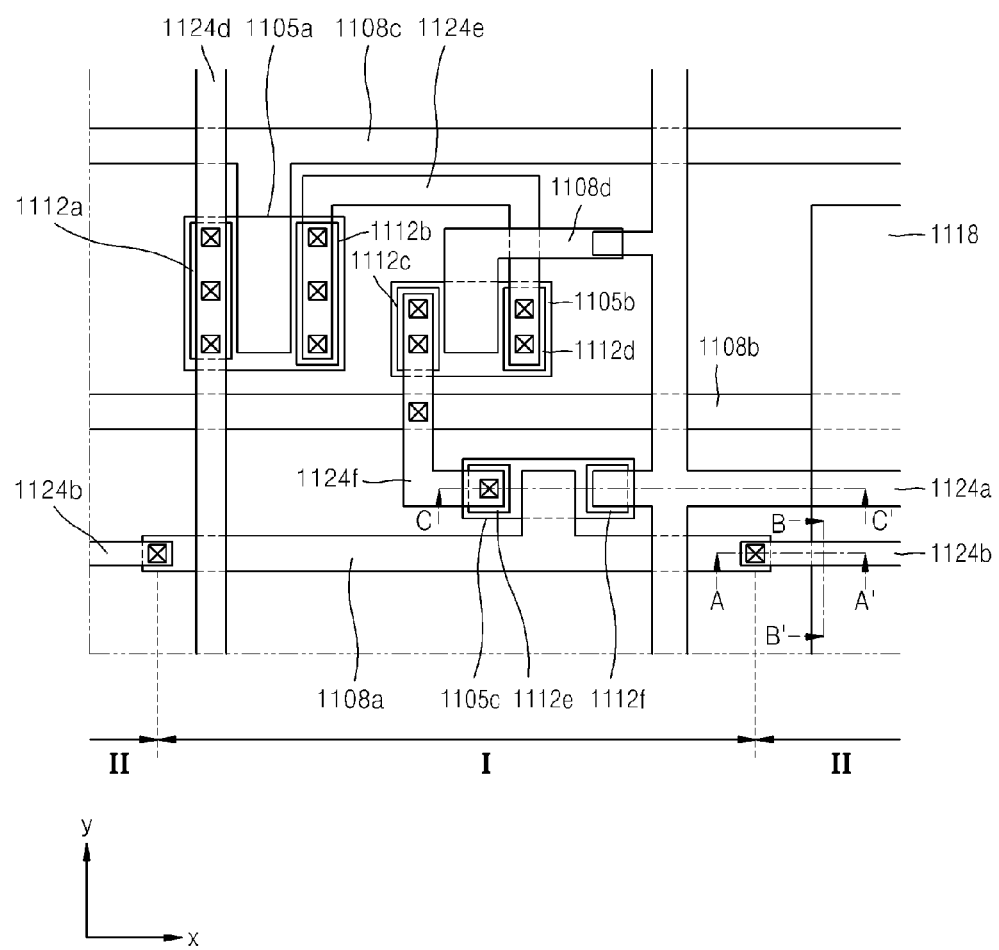
FIG. 6 is a plan view of portions of the pixel area in which the photosensitive pixels illustrated in FIG. 5 are arranged, according to some embodiments.
Figure 7:
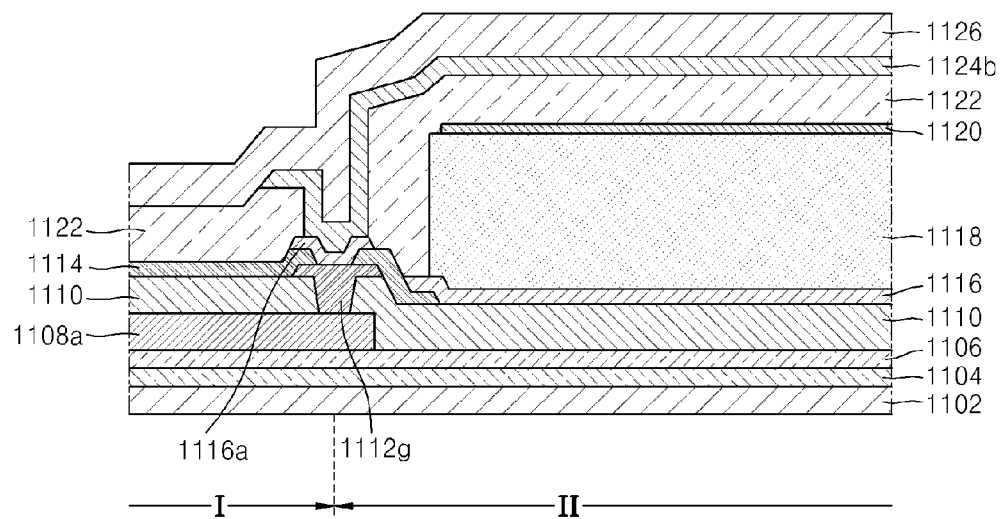
FIG. 7 is a cross-sectional view of an example taken along line A-A' of FIG. 6.
Figure 8:
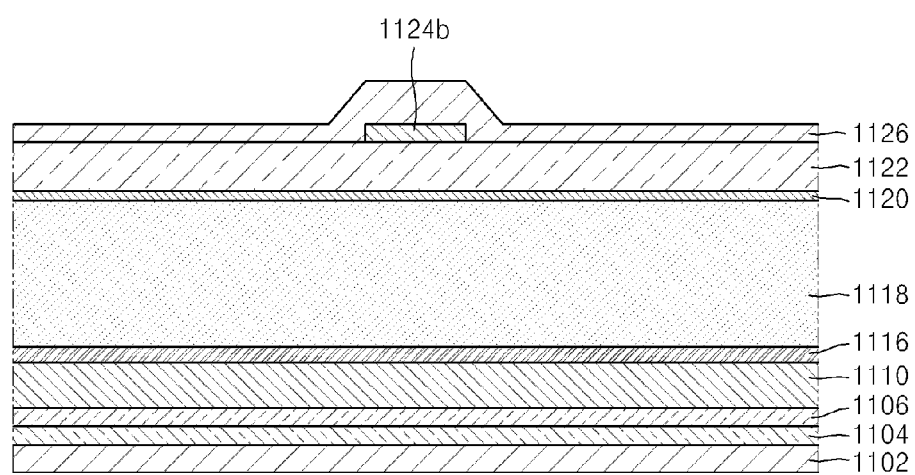
FIG. 8 is a cross-sectional view of an example taken along line B-B' of FIG. 6.
Figure 10:
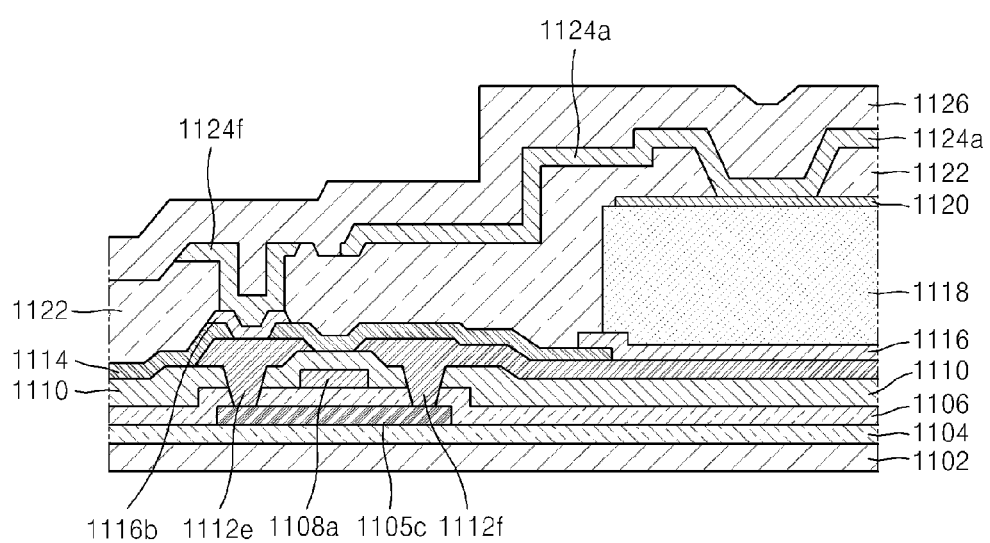
FIG. 10 is a cross-sectional view of an example pixel area taken along line C-C' of FIG. 6.

FIG. 6 is a plan view of portions of the pixel area in which the photosensitive pixels P illustrated in FIG. 5 are arranged, according to some embodiments, and FIG. 7 is a cross-sectional view of an example taken along line A-A' of FIG. 6, and FIG. 8 is a cross-sectional view of an example taken along line B-B' of FIG. 6, and FIG. 10 is a cross-sectional view of an example taken along line C-C' of FIG. 6.

According to some embodiments, a blocking layer 1104 is formed on a substrate 1102, and first through third transistors T1 through T3 and a photodiode PD are formed on the blocking layer 1104.

First, a first semiconductor active layer 1105a, a second semiconductor active layer 1105b, and a third semiconductor active layer 1105c are formed on the blocking layer 1104.

The blocking layer 1104 prevents impurity elements from penetrating the substrate 1102 and planarizes the surface of the substrate 1102. Thus, the blocking layer 1104 may be formed of various types of material that are conducive to these functions. As an example, the blocking layer 1104 may be formed of an inorganic material such as silicon oxide, silicon nitride, silicon oxynitride, aluminum oxide, aluminum nitride, titanium oxide, or titanium nitride, an organic material such as polyimide, polyesther, or acryl, or a stack material thereof. The blocking layer 1104 is not an essential element and may not be formed if necessary.

The first semiconductor active layer 1105a, the second semiconductor active layer 1105b, and the third semiconductor active layer 1105c may include a semiconductor layer formed of a semiconductor by using amorphous silicon, and a resistance contact layer formed of material such as N+ hydrogenation amorphous silicon including silicide or an N-type impurity doped with high concentration.

A gate insulating layer 1106 is formed on the blocking layer 1104 so as to cover the first through third semiconductor active layers 1105a, 1105b, and 1105c, and a first wire metal layer 1108 is formed on the gate insulating layer 1106. The first wire metal layer 1108 includes a first area reset line wire 1108a, a power supply voltage line wire 1108b, a gate line wire 1108c, and a second gate electrode 1108d.

The gate insulating layer 1106 may be formed of tetraethoxysilane (TEOS) that is an insulating material.

The first wire metal layer 1108 may be formed of aluminum-based metal such as aluminum (Al) and an aluminum alloy, silver-based metal such as silver (Ag) and a silver alloy, copper-based metal such as copper (Cu) and a copper alloy, molybdenum-based metal such as molybdenum (Mo) and a molybdenum alloy, chromium (Cr), titanium (Ti), tantalum (Ta), or the like. Additionally, the first wire metal layer 1108 may have a multi-layer structure including two conductive layers (not shown) having different physical properties. One of the two conductive layers may be formed of metal having low resistivity such as aluminum-based metal, silver-based metal, copper-based metal, or the like, so as to reduce signal delay or voltage drop of the first wire metal layer 1108. Unlike this, the other conductive layer may be formed of material different from the material used to the one conductive layer described above, in particular, material having an excellent contact property of indium tin oxide (ITO) and indium zinc oxide (IZO), such as molybdenum-based metal, Cr, Ti, Ta, or the like. Examples of the combination include a Cr lower layer and an Al upper layer, or an Al lower layer and a Mo upper layer. However, the present invention is not limited thereto, and the first wire metal layer 1108 may be formed of various types of metal and conductor.

The first area reset line wire 1108a may be formed in the first area I in the x-direction. Additionally, the first area reset line wire 1108a may be formed to cover a portion that corresponds to a gate area of the third semiconductor active layer 1105c, so as to act as a gate electrode of the third transistor T3.

The power supply voltage line wire 1108b may be formed in the x-direction.

The gate line wire 1108c may be formed in the x-direction. Additionally, the gate line wire 1108c is formed to cover a portion that corresponds to a gate area of the first semiconductor active layer 1105a, so as to form a gate electrode of the first transistor T1.

The second gate electrode 1108d is formed to cover a portion that corresponds to a gate area of the second semiconductor active layer 1105d, so as to be connected to the cathode of the photodiode PD.

An interlayer insulating layer 1110 is formed on the first wire metal layer 1108 so as to cover the first wire metal layer 1108 and the gate insulating layer 1106, and a source/drain metal layer 1112 is formed on the interlayer insulating layer 1106. The source/drain metal layer 1112 includes a first source/drain electrode 1112a, a second source/drain electrode 1112b, a third source/drain electrode 1112c, a fourth source/drain electrode 1112d, a fifth source/drain electrode 1112e, and a sixth source/drain electrode 1112f. The source/drain electrode 1112a and the second source/drain electrode 1112b contact the first semiconductor active layer 1105a through a contact hole and thereby forming a first electrode and a second electrode of the first transistor T1, respectively. The third source/drain electrode 1112c and the fourth source/drain electrode 1112d contact the second semiconductor active layer 1105b through a contact hole and thereby forming a first electrode and a second electrode of the second transistor T2. The fifth source/drain electrode 1112e and the sixth source/drain electrode 1112f contact the third semiconductor active layer 1105c through a contact hole and thereby forming a first electrode and a second electrode of the third transistor T3, as illustrated in FIG. 10. Furthermore, the sixth source/drain electrode 1112f extends to the photodiode area PDA and is formed such that it is connected to a lower electrode layer 1116 of the photodiode PD.

Additionally, according to some embodiments, the source/drain metal layer 1112 may further include a first reset line contact metal 1112g, and the first reset line contact metal 1112g may be formed as illustrated in FIG. 7. The first reset line contact metal 1112g contacts the first area reset line wire 1108a through a contact hole and is formed on the interlayer insulating layer 1110 so as to electrically connect the first area reset line wire 1108a and the second area reset line wire 1124b.

Next, a first passivation layer 1114 is formed on the source/drain metal layer 1112, and a photodiode layer is formed in the photodiode area PDA of the first passivation layer 1114. The photodiode layer includes a lower electrode layer 1116, a photoconductive layer 1118, and an upper electrode layer 1120.

The lower electrode layer 1116 is formed in an area in which the photoconductive layer 1118 is to be formed, as illustrated in FIGS. 7, 8, and 10, thereby forming the cathode of the photodiode PD. When the lower electrode layer 1116 is formed, the second reset line contact metal 1116a may contact the first reset line contact metal 1112g through a contact hole of the first passivation layer 1114 and may be formed so that the first area reset line wire 1108a and the second area reset line wire 1124b can be electrically connected to each other.

The lower electrode layer 1116, the second reset line contact metal 1116a, and a power supply voltage line contact metal may be formed of metal having a small work function such as silver (Ag), magnesium (Mg), aluminum (Al), platinum (Pt), lead (Pt), gold (Au), nickel (Ni), neodymium (Nd), iridium (Ir), chromium (Cr), lithium (Li), calcium (Ca), an alloy thereof, or the like.

The photoconductive layer 1118 may include an amorphous silicon layer including an N-type impurity, an intrinsic amorphous silicon layer that does not include an impurity, and an amorphous silicon layer including a P-type impurity. The photoconductive layer 1119 generates electrons or holes due to light irradiated from the outside.

The upper electrode layer 1120 is a transparent conductive layer formed of, for example, indium tin oxide (ITO), tin oxide (TO), indium zinc oxide (IZO), indium tin zinc oxide (ITZO), or a combination thereof.

Next, a second passivation layer 1122 is formed to cover the upper electrode layer 1120 and the first passivation layer 1114.

A second wire metal layer 1124 is formed on the second passivation layer 1122. The second wire metal layer 1124 includes a bias line wire 1124a, a second area reset line wire 1124b, a data line wire 1124d, a first connection wire 1124e, and a second connection wire 1124f.

The bias line wire 1124a extends in the y-direction and is formed to be electrically connected to the upper electrode layer 1120 of the photodiode PD of the photosensitive diode P, as illustrated in FIG. 10.

The second area reset line wire 1124b extends to the second area II in the x-direction and is electrically connected to the first area reset line wire 1108a through the contact hole of the second passivation layer 1122, the second reset line contact metal 1116a, and the first reset line contact metal 1112g, as illustrated in FIG. 7.

The data line wire 1124d extends in the y-direction and is formed to be electrically connected to the first source/drain electrode 1112a of the first transistor T1 through a contact hole and a contact metal.

The first connection wire 1124e is formed to electrically connect the second source/drain electrode 1112b of the first transistor T1 and the fourth source/drain electrode 1112d of the second transistor T2 to one another.

The second connection wire 1124f is formed to electrically connect the third source/drain electrode 1112c of the second transistor T2 and the fifth source/drain electrode 1112e of the third transistor T3 each other.

The second wire metal layer 1124 may be formed of high-resistance metal such as Cr, molybdenum-based metal, Ta, Ti, or the like. Additionally, the second wire metal layer 1124 may have a multi-layer structure including a lower layer (not shown) formed of a high resistant metal or the like and an upper layer (not shown) formed of low resistance material and formed on the lower layer. Examples of multi-layer structures include a triple layer such as a Mo—Al—Mo layer, as well as a double layer such as a Cr lower layer and an Al upper layer, or an Al lower layer and an Mo upper layer.

Next, a third passivation layer 1126 is formed on the second wire metal layer 1124 and the second passivation layer 1122.

As described above, the fill factor of the X-ray detector 100 is increased as the area of the photodiode area PDA in which the photodiode PD is formed, is increased. Therefore, photoelectric transformation efficiency is improved.

Figure 9:
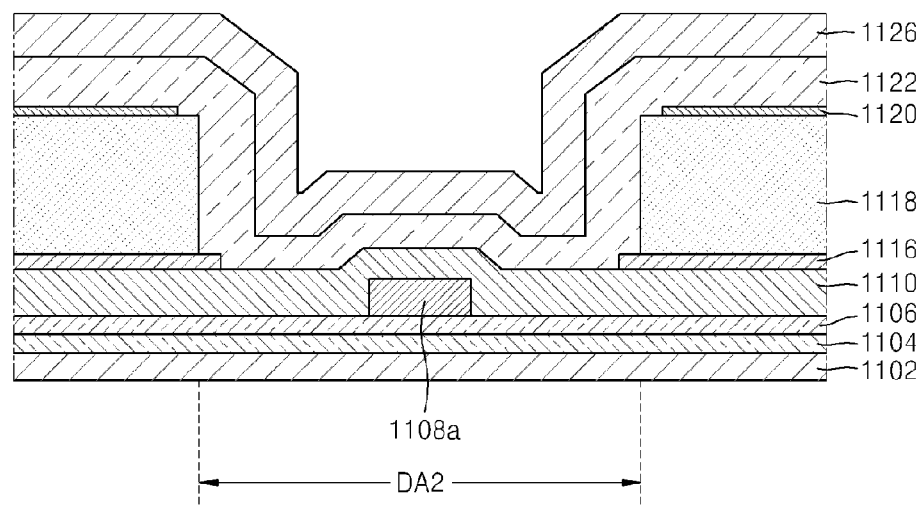
FIG. 9 is a cross-sectional view taken along line B-B' of FIG. 6 in a comparative example.

FIG. 9 is a cross-sectional view taken along line B-B' of FIG. 6 in a comparative example in which the reset lines RL are not arranged in a first layer (the first wire metal layer 1108 in FIGS. 7, 8, and 10) and a second layer (the second wire metal layer 1124 in FIGS. 7, 8, and 10) according to the above described embodiments but extend only from the first layer. In the comparative example of FIG. 9, the reset lines RL are formed in the first layer in the photodiode area PDA, and the photoconductive layer 1118 may not be formed in the area in which the reset lines RL are formed. Additionally, the photoconductive layer 118 is not formed in an area close to the area in which the reset lines RL are formed, i.e., in the second wire area DA2. Thus, the fill factor of the X-ray detector 100 is reduced.

According to some embodiments, the reset lines RL are arranged in the second layer in the second area II in which the photodiode PD is formed. Thus, the photoconductive layer 1118 may be formed in the area of the second area II in which the reset lines RL are formed so that the fill factor of the X-ray detector 100 can be improved.

Figure 11:
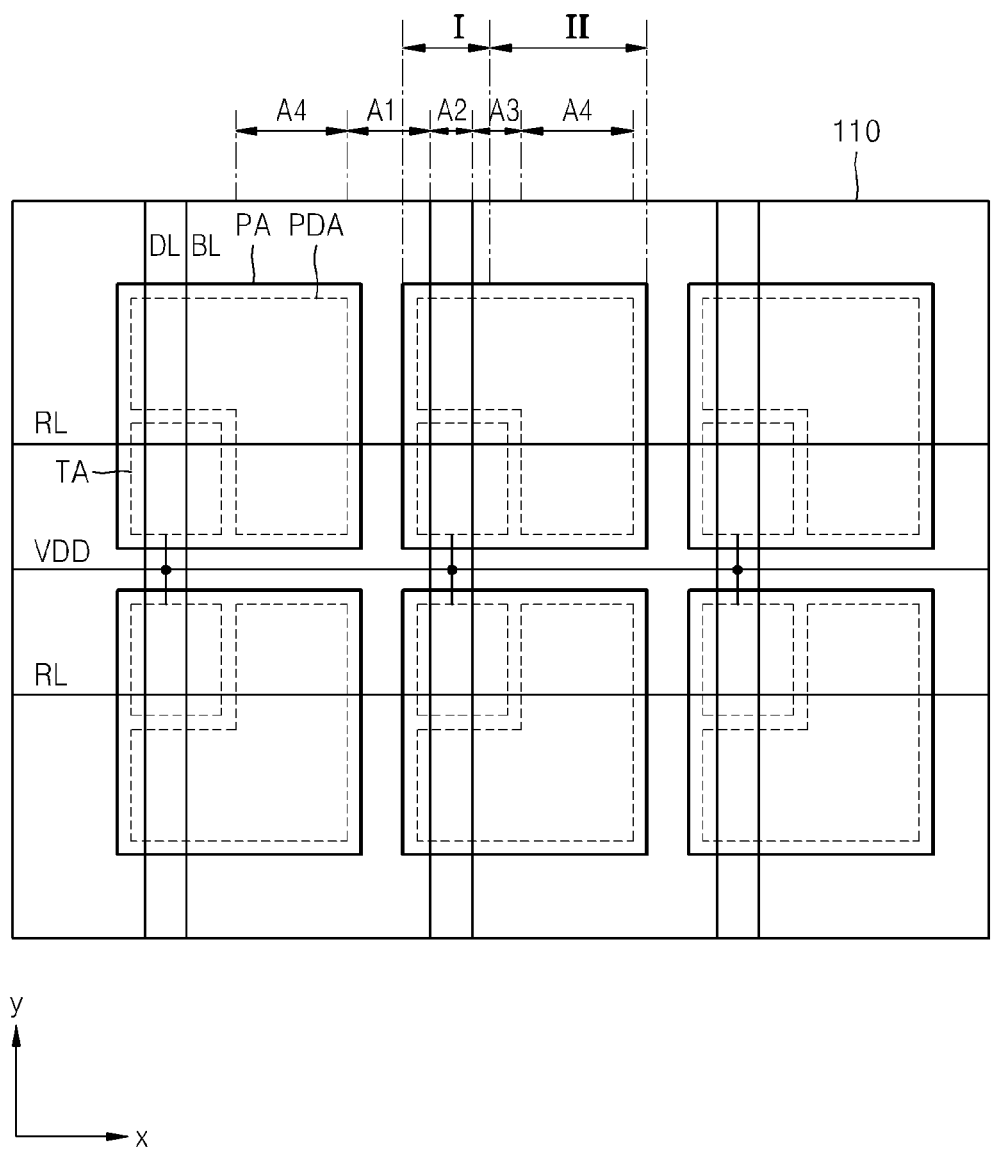
FIG. 11 illustrates the arrangement of a pixel area and wire connections, according to some embodiments.

FIG. 11 illustrates the arrangement of a pixel area and wires, according to another embodiment of the present invention.

According to some embodiments, photosensitive pixels P arranged adjacent to one another in rows share the power supply voltage lines VDD. To this end, as illustrated in FIG. 11, in the photosensitive pixel P arranged in an odd-numbered row in an array of photosensitive pixels P, the transistor area TA may be arranged on the lower side of the photosensitive pixel P in the y-direction, and in the photosensitive pixel P arranged in an even-numbered row in the array of photosensitive pixels P, the transistor area TA may be arranged on the upper side of the photosensitive pixel P in the y-direction. In the embodiment illustrated in FIG. 11, the power supply voltage lines VDD are shared by the photosensitive pixels P arranged in two rows so that the number of power supply voltage lines VDD can be reduced to about half. As the number of power supply voltage lines VDD is reduced, an area in which the power supply voltage lines VDD are to be arranged, is reduced to about half. Thus, portions of the area in which the power supply voltage lines VDD have been arranged may be used as the photodiode area PDA. Therefore, according to the some embodiments, the fill factor of the X-ray detector 100 may be improved by increasing the ratio of the photodiode area PDA.

Furthermore, according to some embodiments, the power supply voltage lines VDD have been arranged outside the pixel area PA. This configuration may apply to the embodiments described above. In other words, in FIGS. 5, 6, 7, 8, and 10, the power supply voltage lines VDD may be arranged outside the pixel area PA.

Although, in the embodiment described with reference to FIG. 11, the power supply voltage lines VDD extend in the x-direction, i.e., in a row direction, an embodiment in which the power supply voltage lines VDD extend in the y-direction, i.e., in a column direction may be also be provided.

While this invention has been particularly shown and described with reference to some embodiments thereof, it will be understood by those skilled in the art that various changes in form and details may be made therein without departing from the spirit and scope of the invention as defined by the appended claims. The embodiments should be considered as descriptive only and not for purposes of limitation. Therefore, the scope of the invention is defined not by the detailed description of the invention but by the appended claims. Any differences within the scope should be construed as being included in the present invention.

What is claimed is:

1. A thin film transistor (TFT) array substrate for an X-ray detector, comprising:
a substrate including a plurality of pixel areas each including a transistor area in which a TFT is formed, and a photodiode formed in a photodiode area;
a first wire extending through the plurality of pixel areas on the substrate, wherein the first wire is formed in a first layer disposed in a lower portion of a photodiode layer in which the photodiode is formed, in at least one portion of the transistor area, and wherein the first wire is formed in a second layer disposed in an upper portion of the photodiode layer in the photodiode area;
a second wire, insulated from the first wire, and extending in the plurality of pixel areas and formed in the second layer; and at least one TFT formed in the transistor area and electrically connected to at least one of the first wire and the second wire.

2. The TFT array substrate of claim 1, wherein the first wire is formed in the first layer at least in a region in which the second wire is formed.

3. The TFT array substrate of claim 1, wherein the first wire and the second wire are disposed to intersect each other, and each of the plurality of pixel areas is disposed in an area in which the first wire and the second wire intersect each other.

4. The TFT array substrate claim 1, further comprising an interlayer connection portion electrically connecting the first wire formed in the first layer and the second wire formed in the second layer through at least one contact metal and at least one contact hole.

5. The TFT array substrate of claim 1, further comprising a plurality of power supply voltage lines supplying power supply voltages to a plurality of pixels formed in each of the plurality of pixel areas and shared by pixels arranged in a plurality of rows or columns.

6. The TFT array substrate for an X-ray detector of claim 1, wherein the first wire extends in a first direction and comprises a plurality of reset lines transmitting reset signals, and the second wire extends in a second direction and comprises a plurality of data lines transmitting detection signals generated in the photodiode, and a plurality of bias lines transmitting bias voltages, wherein the second direction intersects the first direction, the TFT array substrate for an X-ray detector further comprising:
  a plurality of power supply voltage lines transmitting power supply voltages; and
  a plurality of gate lines extending in the first direction and transmitting gate pulses,
  wherein at least one TFT comprises first through third transistors, and the first transistor comprises a gate terminal connected to the gate lines, a first terminal connected to the data lines, and a second terminal connected to the first terminal of the second transistor, and
  the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
  the third transistor comprises a gate terminal connected to the reset lines, a first terminal connected to the gate terminal of the second transistor and the lower electrode of the photodiode, and a second terminal connected to the second terminal of the second transistor and the power supply voltage lines.

7. The TFT array substrate for an X-ray detector of claim 1, wherein the first wire extends in a first direction and comprises a plurality of reset lines transmitting reset signals and a plurality of power supply voltage lines transmitting power supply voltages, and the second wire extends in a second direction, wherein the second direction intersects the first direction, and wherein the TFT array comprises a plurality of data lines transmitting detection signals generated in the photodiode, and a plurality of bias lines transmitting bias voltages, the TFT array substrate for an X-ray detector further comprising:
  a plurality of gate lines extending in the first direction and transmitting gate pulses,
  wherein the at least one TFT comprises first through third transistors, and the first transistor comprises a gate terminal connected to the gate lines, a first terminal connected to the data lines, and a second terminal connected to the first terminal of the second transistor, and
  the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
  the third transistor comprises a gate terminal connected to the reset lines, a first terminal connected to the gate terminal of the second transistor and the lower electrode of the photodiode, and a second terminal connected to the second terminal of the second transistor and the power supply voltage lines.

8. The TFT array substrate for an X-ray detector of claim 1, wherein the first wire extends in a first direction and comprises a plurality of data lines transmitting detection signals generated in the photodiode, and the second wire extends in a second direction to intersect the first wire and comprises a plurality of reset lines transmitting reset signals, the TFT array substrate for an X-ray detector further comprising:
  a plurality of bias lines transmitting bias voltages;
  a plurality of power supply voltage lines transmitting power supply voltages; and
  a plurality of gate lines extending in the second direction,
  wherein the at least one TFT comprises first through third transistors, and the first transistor comprises a gate terminal connected to the gate lines, a first terminal connected to the data lines, and a second terminal connected to the first terminal of the second transistor, and
  the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
  the third transistor comprises a gate terminal connected to the reset lines, a first terminal connected to the gate terminal of the second transistor and the lower electrode of the photodiode, and a second terminal connected to the second terminal of the second transistor and the power supply voltage lines.

9. The TFT array substrate for an X-ray detector of claim 1, wherein the first wire comprises a plurality of data lines extending in a first direction, and a plurality of bias lines transmitting bias voltages, and the second wire extends in a second direction to intersect the first wire and comprises a plurality of reset lines transmitting reset signals and a plurality of power supply voltage lines transmitting power supply voltages, the TFT array substrate for an X-ray detector further comprising a plurality of gate lines extending in the second direction,
  wherein the at least one TFT comprises first through third transistors, and the first transistor comprises a gate terminal connected to the gate lines, a first terminal connected to the data lines, and a second terminal connected to the first terminal of the second transistor, and
  the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
  the third transistor comprises a gate terminal connected to the reset lines, a first terminal connected to the gate terminal of the second transistor and the lower electrode of the photodiode, and a second terminal connected to the second terminal of the second transistor and the power supply voltage lines.

10. The TFT array substrate for an X-ray detector of claim 1, wherein the photodiode layer comprises:
   a lower electrode layer configured to form a cathode of the photodiode;
   a photoconductive layer configured to generate an electrical signal according to incident light; and
   an upper electrode layer configured to form an anode of the photodiode and formed of a transparent conductive layer.

11. An X-ray detector comprising:
   a thin film transistor (TFT) array substrate comprising a plurality of photosensitive pixels comprising a photodiode generating an electrical detection signal corresponding to incident light and at least one transistor transmitting the electrical detection signal;
   a gate driver configured to supply gate pulses for turning on the at least one transistor to the plurality of photosensitive pixels; and
   a readout integrated circuit (IC) configured to read out the electrical detection signal from the plurality of photosensitive pixels,
   wherein the TFT array substrate comprises:
   a substrate comprising a plurality of pixel areas each comprising a transistor area in which a TFT is formed, and a photodiode area in which a photodiode is formed;
   a first wire extending in the plurality of pixel areas on the substrate, wherein the first wire formed in a first layer disposed in a lower portion of a photodiode layer in which the photodiode is formed, in at least one portion of the transistor area, and wherein the first wire is formed in a second layer disposed in an upper portion of the photodiode layer in the photodiode area;
   a second wire insulated from the first wire, extending in the plurality of pixel areas and formed in the second layer; and
   at least one TFT formed in the transistor area and electrically connected to at least one of the first wire and the second wire.

12. The X-ray detector of claim 11, wherein the first wire is formed in the first layer at least in a region in which the second wire is formed.

13. The X-ray detector of claim 11, wherein the first wire and the second wire are disposed to intersect each other, and each of the plurality of pixel areas is disposed in an area in which the first wire and the second wire intersect each other.

14. The X-ray detector of claim 11, further comprising an interlayer connection portion electrically connecting the first wire formed in the first layer and the second wire formed in the second layer through at least one contact metal and contact hole.

15. The X-ray detector of claim 11, further comprising a power supply voltage supply unit configured to supply power supply voltages to the plurality of photosensitive pixels; and a plurality of power supply voltage lines configured to transmit the power supply voltages to the plurality of photosensitive pixels, wherein the plurality of power supply voltage lines are shared by pixels arranged in a plurality of rows or columns.

16. The X-ray detector of claim 11, further comprising:
   a bias supply unit configured to supply bias voltages to the plurality of photosensitive pixels; and
   a power supply voltage supply unit configured to supply power supply voltages to the plurality of photosensitive pixels,
   wherein the gate driver is formed to further supply reset signals to the plurality of photosensitive pixels, and the first wire extends in a first direction and comprises a plurality of reset lines configured to transmit reset signals, and the second wire extends in a second direction and comprises a plurality of data lines transmitting detection signals generated in the photodiode to the readout IC, wherein the first direction intersects the second direction, and a plurality of bias lines transmitting the bias voltages, the TFT array substrate further comprising:
   a plurality of power supply voltage lines configured to transmit the power supply voltages; and
   a plurality of gate lines extending in the first direction and transmitting the gate pulses, and the at least one TFT comprises first through third transistors, wherein the first transistor comprises a gate terminal connected to the gate lines, a first terminal connected to the data lines, and a second terminal connected to the first terminal of the second transistor, and
   the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
   the third transistor comprises a gate terminal connected to the reset lines, a first terminal connected to the gate terminal of the second transistor and the lower electrode of the photodiode, and a second terminal connected to the second terminal of the second transistor and the power supply voltage lines.

17. The X-ray detector of claim 11, further comprising:
   a bias supply unit configured to supply bias voltages to the plurality of photosensitive pixels; and
   a power supply voltage supply unit configured to supply power supply voltages to the plurality of photosensitive pixels,
   wherein the gate driver is formed to further supply reset signals to the plurality of photosensitive pixels, and the first wire extends in a first direction and comprises a plurality of reset lines transmitting the reset signals and a plurality of power supply voltage lines transmitting the power supply voltages, and the second wire extends in a second direction to intersect the first wire and comprises a plurality of data lines transmitting detection signals generated in the photodiode to the readout IC, and a plurality of bias lines transmitting the bias voltages, and the TFT array substrate further comprises a plurality of gate lines extending in the first direction and transmitting the gate pulses, and the at least one TFT comprises first through third transistors, and the first transistor comprises a gate terminal connected to the gate lines, a first terminal connected to the data lines, and a second terminal connected to the first terminal of the second transistor, and
   the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
   the third transistor comprises a gate terminal connected to the reset lines, a first terminal connected to the gate terminal of the second transistor and the lower electrode of the photodiode, and a second terminal connected to the second terminal of the second transistor and the power supply voltage lines.

18. The X-ray detector of claim 11, further comprising:
a bias supply unit configured to supply bias voltages to the plurality of photosensitive pixels; and
a power supply voltage supply unit configured to supply power supply voltages to the plurality of photosensitive pixels,
wherein the gate driver is configured to further supply reset signals to the plurality of photosensitive pixels, and the first wire extends in a first direction and comprises a plurality of data lines transmitting detection signals generated in the photodiode to the readout IC, and the second wire extends in a second direction and comprises a plurality of reset lines transmitting the reset signals, the first direction intersecting the second direction, and the TFT array substrate further comprises:
  a plurality of bias lines configured to transmit the bias voltages,
  a plurality of power supply voltage lines configured to transmit the power supply voltages, and
  a plurality of gate lines extending in the second direction and configured to transmit the gate pulses, and the at least one TFT comprises first through third transistors, wherein the first transistor comprises a gate terminal connected to the gate lines, a first terminal connected to the data lines, and a second terminal connected to the first terminal of the second transistor, and
  the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
  the third transistor comprises a gate terminal connected to the reset lines, a first terminal connected to the gate terminal of the second transistor and the lower electrode of the photodiode, and a second terminal connected to the second terminal of the second transistor and the power supply voltage lines.

19. The X-ray detector of claim 11, further comprising:
a bias supply unit configured to supply bias voltages to the plurality of photosensitive pixels; and
a power supply voltage supply unit configured to supply power supply voltages to the plurality of photosensitive pixels,
wherein the gate driver is configured to further supply reset signals to the plurality of photosensitive pixels, and the first wire extends in a first direction and comprises a plurality of data lines transmitting detection signals generated in the photodiode to the readout IC, and a plurality of bias lines transmitting the bias voltages, and the second wire extends in a second direction and comprises a plurality of reset lines transmitting the reset signals and a plurality of power supply voltage lines transmitting the power supply voltages, the first direction intersecting the second direction, the TFT array substrate further comprises a plurality of gate lines extending in the second direction and configured to transmit the gate pulses, and the at least one TFT comprises first through third transistors, and the first transistor comprises a gate terminal connected to the gate lines, a first terminal connected to the data lines, and a second terminal connected to the first terminal of the second transistor, and
the second transistor comprises a gate terminal connected to a lower electrode of the photodiode and a first terminal of the third transistor, a first terminal connected to the second terminal of the first transistor, and a second terminal connected to a second terminal of the third transistor and the power supply voltage lines, and
the third transistor comprises a gate terminal connected to the reset lines, a first terminal connected to the gate terminal of the second transistor and the lower electrode of the photodiode, and a second terminal connected to the second terminal of the second transistor and the power supply voltage lines.

20. The X-ray detector of claim 11, wherein the photodiode layer comprises:
a lower electrode layer configured to form a cathode of the photodiode;
a photoconductive layer configured to generate an electrical signal according to incident light; and
an upper electrode layer configured to form an anode of the photodiode and formed of a transparent conductive layer.

* * * * *

UNITED STATES PATENT AND TRADEMARK OFFICE
CERTIFICATE OF CORRECTION

| | | |
|---|---|---|
| PATENT NO. | : 8,476,596 B2 | |
| APPLICATION NO. | : 13/301486 | |
| DATED | : July 2, 2013 | |
| INVENTOR(S) | : Shin | |

It is certified that error appears in the above-identified patent and that said Letters Patent is hereby corrected as shown below:

In the Specification

Column 9 line 12, Change "polyesther," to --polyester,--.

In the Claims

Column 13 line 12, In Claim 4, after "substrate" insert --of--.

Signed and Sealed this
Seventh Day of January, 2014

Margaret A. Focarino
*Commissioner for Patents of the United States Patent and Trademark Office*